Aug. 10, 1965 E. C. RHYNE, JR., ETAL 3,200,322

TRANSISTOR SWITCHING CIRCUIT

Filed July 21, 1961 2 Sheets-Sheet 1

Aug. 10, 1965 E. C. RHYNE, JR., ETAL 3,200,322

TRANSISTOR SWITCHING CIRCUIT

Filed July 21, 1961 2 Sheets-Sheet 2

United States Patent Office 3,200,322
Patented Aug. 10, 1965

3,200,322

TRANSISTOR SWITCHING CIRCUIT

Earl C. Rhyne, Jr., East Pepperell, and John S. Contino, South Acton, Mass., assignors to The Warren Manufacturing Company, Inc., Littleton, Mass., a corporation of Massachusetts Filed July 21, 1961, Ser. No. 125,863
14 Claims. (Cl. 321—18)

Our invention relates to transistor switching amplifiers, and particularly to means for automatically protecting such amplifiers from voltage surges and the adverse effects of short circuits.

Switching transistor amplifiers or inverters conventionally generate an alternating output from a constant voltage input and in common with all transistorized equipment, switching amplifiers are likely to be permanently damaged by faulty conditions. Faulty conditions such as over-current from short-circuits and over-voltage from voltage surges may be caused by failure of components, external influences and the like. An obvious means for avoiding the effects of excess load current is to limit the current to amplifier components by a power-dissipating resistor in series with the voltage source. However, this results in undesirable voltage variations when the load impedance changes.

It is an object of this invention to provide a switching amplifier wherein the components and the load are protected from the effects of excess current due to overload and wherein the energizing voltage is maintained constant over the useful range of current loads.

It is another object of this invention to provide a switching amplifier or inverter which includes circuitry for protection thereof from over-voltage, over-current, or both, in a manner such as to maintain within safe limits the amount of power dissipated by the components in the event of over-voltage or over-current, and which provides for immediate restoration of normal operation upon elimination of the faulty conditions.

Another object of the invention is to provide an inverter circuit as described which will protect the components thereof from input-voltage transient surges independently of the duration of such surges.

It is moreover an object of this invention to provide an inverter having the above advantages while using a minimum number of readily available system components.

A more general object of the invention is to provide a switching amplifier having a regulated output.

The foregoing and other objects and advantages of the invention as well as the essential features by virtue of which they are achieved, will be apparent from, and will be set forth in, the following description in conjunction with the accompanying drawings in which there is exemplified a transistor amplifier circuit which embodies the various features of the invention.

Figures 1, 2:
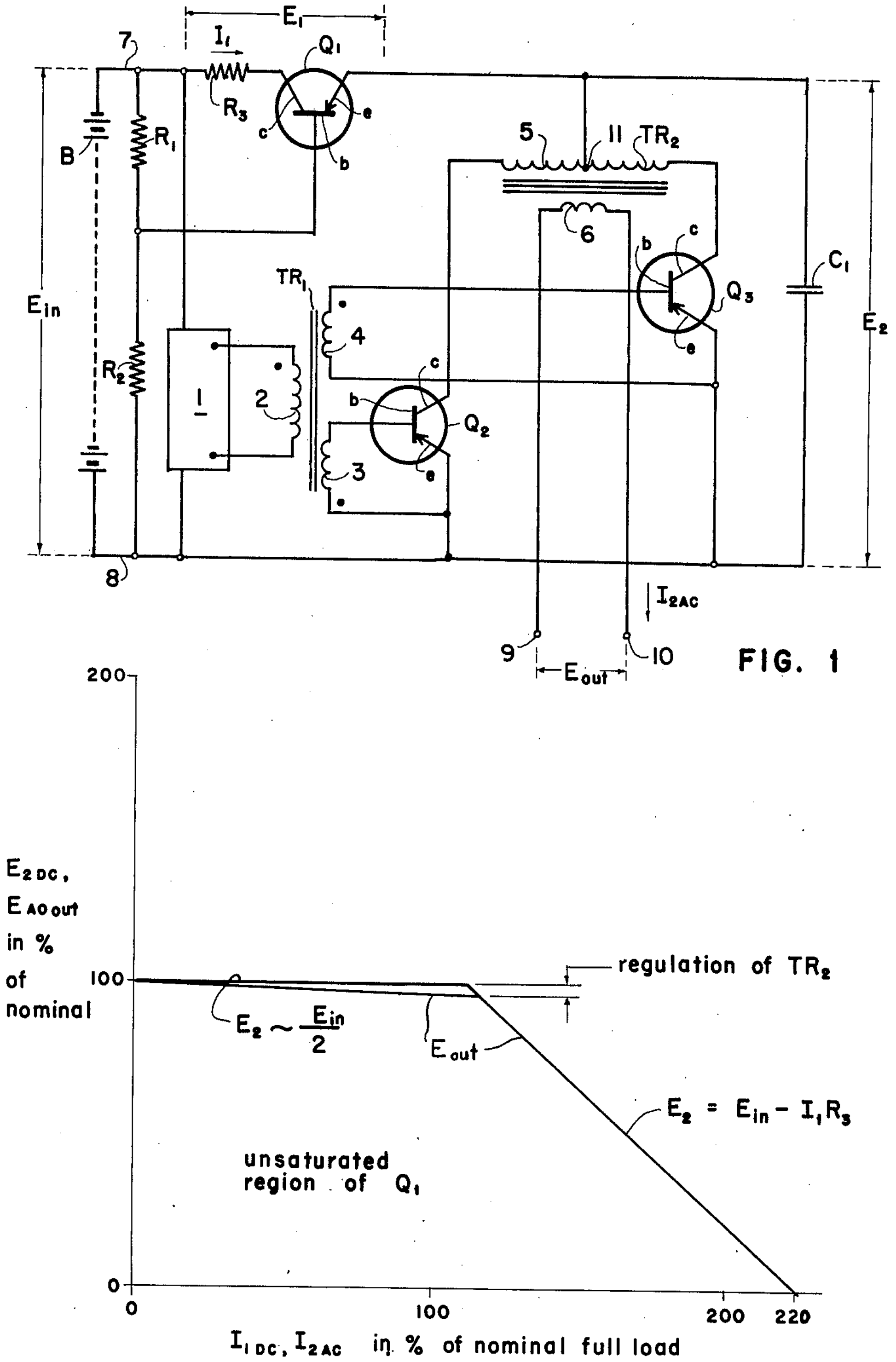
FIG. 1 illustrates a switching transistor amplifier connected to a voltage source and including an over-current and over-voltage protecting circuit.
FIG. 2 is a graph illustrating the variation of output voltage (expressed as a percent of nominal output voltage) as the load current in FIG. 1 (expressed as a percent of full load) varies from 0 to 220% of full load.
Figure 3A:
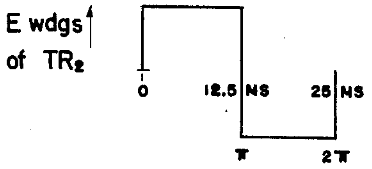
Figure 3B:
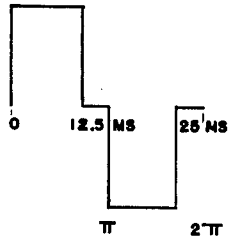
Figure 3C:
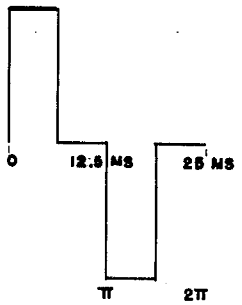
Figure 4A:
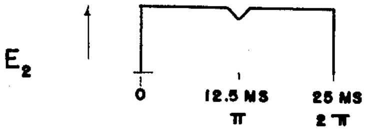
Figure 4B:
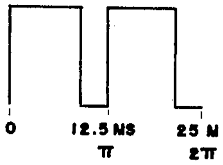
Figure 4C:
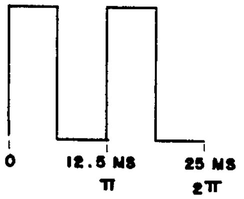
Figure 5A:
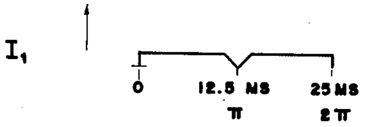
Figure 5B:
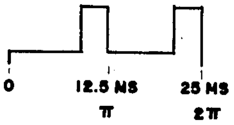
Figure 5C:
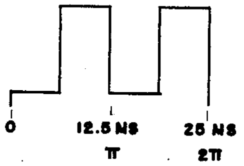
Figure 6:
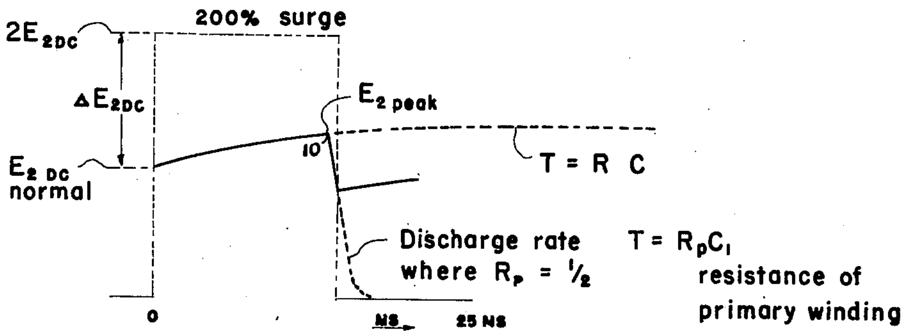

FIGS. 3*a*, 3*b*, 3*c* are graphs illustrating, by way of three curves, the voltages across the output winding of the switching transformer in FIG. 1 for various input voltages when the effect of the capacitor in FIG. 1 is ignored;

FIGS. 4*a*, 4*b*, 4*c* are graphs illustrating, by way of three curves, the voltage $E_2$ in FIG. 1 for various input voltages when the effect of the capacitor in FIG. 1 is ignored;

FIGS. 5*a*, 5*b*, 5*c* are graphs illustrating, by way of three curves, the current to the transformer tap in FIG. 1 for various input voltages when the effect of the capacitor in FIG. 1 is ignored; and FIG. 6 is a graph illustrating the effect of the capacitor in FIG. 1 upon the voltage illustrated in FIG. 4*c*.

Referring to FIG. 1, a D.-C. voltage source, which is illustrated as a battery B, and in the specification is hereafter referred to as "source B," exhibits a voltage $E_{in}$ poled as shown. A bus 8 is connected to the positive terminal of the source B, and a connector 7, which is joined to the negative terminal of the source B, terminates in a power-dissipating dropping resistor $R_3$. A regulating transistor $Q_1$ is connected by means of its collector *c* to the resistor $R_3$, and by means of its base *b* to the mid-potential of a voltage divider comprised of serially connected resistors $R_1$ and $R_2$. The serially connected resistors $R_1$ and $R_2$ are in turn connected across the source B at the conductor 7 and the bus 8.

The voltage across the emitter-collector circuit of transistor $Q_1$ and the resistor $R_3$ is designated herein as $E_1$. $E_2$ designates the voltage across the switching transformer section, namely the voltage from emitter *e* of transistor $Q_1$ to the bus 8.

A saturable transformer $TR_2$ includes a center-tapped primary winding 5, which is connected at its center tap 11 to the emitter *e* of transistor $Q_1$, and a secondary winding 6 which is connected to a pair of output terminals 9 and 10.

The transformer winding 5 is connected at each end to one collector *c* of a pair of power-type switching transistors $Q_2$ and $Q_3$. The emitters *e* of the transistors $Q_2$ and $Q_3$ are energized by the bus 8 so that when one of the transistors $Q_2$ or $Q_3$ is biased to a condition of saturation a low impedance path exists from one end of the winding 5 to the bus 8.

An oscillator 1 excited between the connector 7 and the bus 8, operates at 40 cycles per second and energizes the primary winding 2 of a transformer $TR_1$. The transformer $TR_1$ includes a pair of secondary windings 3 and 4 which are connected across the emitter-base circuits of the transistors $Q_2$ and $Q_3$ respectively, and are wound for producing biasing potentials phased to alternately saturate the transistors $Q_2$ and $Q_3$. In FIG. 1 dots designate all winding ends which exhibit like polarity at any instant, in accordance with the standards of the American Institute of Electrical Engineers. Thus, if the dotted end of any winding exhibits a positive polarity at any instant, the dotted ends of all the windings are positive. A capacitor $C_1$ shunts the circuit from the emitter *e* of transistor $Q_1$ to the bus 8.

Relative to the terminology used herein, it should be noted that junction transistors of the type used operate in three recognizable regions, depending upon the biasing currents. A transistor may be biased "off" or beyond cut-off so that the total collector current thereof is limited to the collector leakage current. This is referred to as the cut-off region. A transistor may be biased "on" into power-amplifying condition, wherein variations in the emitter-base biasing current result in corresponding changes in the collector current. This is referred to as the "active" or power amplifying region. A transistor may also be biased "on" so that collector current increases to a region wherein the emitter-base biasing current has little control over collector current and the voltage drop across the emitter-collector circuit of the transistor is effectively zero. This is referred to as the region of saturation and while the transistor so biased is generally characterized as "on," it is more particularly characterized as "saturated" or "turned on hard."

In order to illustrate more fully the principles of the present invention, the following values are assigned to the various components of the circuit in FIG. 1, although it will be understood that such values are exemplary rather than limiting. In FIG. 1 the resistors $R_1$ and $R_2$ are each 250 ohms, while the resistor $R_3$ has a value of 50 ohms. The voltage source B supplies a nominal value of 50 volts and the capacitor $C_1$ has a magnitude of 600 microfarads with a limit of 30 volts. The element $Q_1$ is a 2N278 Delco p-n-p power transistor, while the elements $Q_2$ and $Q_3$ are each 2N1159 Delco p-n-p power transistors.

In normal operation for nominal values of load current and voltage, the voltage divider comprised of resistors $R_1$, $R_2$ supplies to the base *b* of transistor $Q_1$ a voltage which is approximately one-half of the voltage $E_{in}$. The voltage $E_{in}$ is in turn applied to the collector *c* of transistor $Q_1$. The emitter *e* of transistor $Q_1$ is electrically separated from the bus 8 by the composite impedance of the capacitor $C_1$, the elements associated with the transformer $TR_1$, and the load across terminals 9 and 10. In normal operation this latter composite impedance has a value, together with resistor $R_3$, such as to bias the collector *c* of transistor $Q_1$ into a non-saturated "on" condition, and the voltage $E_2$ is substantially equal to the voltage at base *b* less the negligible forward voltage drop across the emitter-base junction of transistor $Q_1$. The latter voltage drop is approximately zero and may be ignored. If the input voltage $E_{in}$ remains constant, thereby maintaining constant the voltage at the base *b*, the voltage $E_2$ at the emitter of transistor $Q_1$ remains substantially constant and equal to one-half $E_{in}$.

As indicated above, each end of transformer winding 5 is connected through the collector-emitter circuit of the transistors $Q_2$ and $Q_3$ respectively to the bus 8. Accordingly, application of transistor-saturating excitation to the emitter-base circuit of these transistors in alternate succession causes each half of winding 5 to be, in effect, alternately connected to the bus 8 through a very low impedance, thereby producing successive currents in opposite directions in winding 5 and thus alternating signals at the transformer winding 6 and the terminals 9 and 10.

Relative to this transistor-saturating excitation, the oscillator 1 provides an alternating signal for the winding 2 which produces an alternating signal at the windings 3 and 4. The latter signals are applied to the respective bases *b* of the transistors $Q_2$ and $Q_3$. The signals are of such magnitude as to produce in the transistors saturating conduction after the first few degrees of the respective negative half cycles of the signals, and cut-off during the respective positive half cycles. For example when the dotted end of winding 4 becomes positive and the undotted end of winding 3 becomes negative a heavy forward bias is placed on the emitter-base circuit of transistor $Q_2$ and a back bias is placed on the emitter-base circuit of transistor $Q_3$ thus turning transistor $Q_2$ "on" and turning transistor $Q_3$ "off." The magnitude of the excitation and bias on the emitter-base circuit of transistor $Q_3$ is such as to produce saturation of that transistor within the first few degrees on the "on" cycle of that transistor. Accordingly, the left-hand end of winding 5 is substantially subjected to heavy current flow through the transistor $Q_2$ to bus 8. On the opposite half cycle of the alternating excitation from the oscillator 1 in the transformer primary 2, the emitter of transistor $Q_3$ is made rapidly positive to produce saturation of transistor $Q_3$ while transistor $Q_2$ is cut off.

The operation of this devise in the normal operating range thereof having thus been established, the effects of over-current and over-voltage will now be considered. Each value of load current $I_2$ corresponds to a value of $I_1$. The beforementioned parameters for FIG. 1 were selected to produce non-saturated operation of transistor $Q_1$ within the normal operating range and to produce saturation of the transistor $Q_1$ when the current through the resistor $R_3$ corresponds to 110% of full-load current at terminals 9 and 10. During saturation of transistor $Q_1$ the voltage across the emitter-collector circuit of the transistor $Q_1$ is substantially not dependent upon the current through the emitter-base junction. Furthermore, the voltage across the collector-emitter circuit of transistor $Q_1$ is then no longer dependent upon the current therethrough. In fact the voltage across the emitter-collector circuit of transistor $Q_1$ is effectively reduced to zero and the voltage across the resistor $R_3$ is substantially equal to the voltage $E_1$. During saturation of transistor $Q_1$ $$E_2 = E_{in} - E_1 = E_{in} - I_1 R_3$$

Thus when transistor $Q_1$ is saturated, it has practically no effect on current $I_1$, so that the latter is controlled only by resistor $R_3$ and the voltage $E_2$ varies with the impedance of the circuit defined from emitter *e* of transistor $Q_1$ to the bus 8. As the current $I_1$ through this circuit increases, the voltage drop across the resistor $R_3$ increases and the resulting voltage $E_2$ decreases. In this condition, the current $I_1$ is limited to a maximum of $E_{in}/R_3$ and the resistor $R_3$ acts to dissipate the power associated with high currents. The current limiting effects of the power-dissipating resistor, and the voltage changes associated therewith, prevail only when the load current exceeds 110% of full load value.

The curve followed by the voltage $E_2$ is shown in FIG. 2. $E_2$ is expressed in percent of the nominal value of $E_2$, as $I_1$ and $I_2$ vary. This figure expresses graphically the above-discussed result, namely that up to the predetermined value of load current $I_2$ of 110% full load, the value of voltage $E_2$ is substantially constant because transistor $Q_1$ operates in the unsaturated region, whereas the voltage $E_2$ drops when the current $I_1$ exceeds the 110% value. The linear voltage decline has a slope equal to approximately $-R_3$.

Further, with respect to overload and short-circuit protection, $E_2$ maintains its value as $$\frac{E_{in}}{2}$$

as long as the relationship $$I_1 R_3 < \frac{E_{in}}{2}$$

exists.

For values of $$I_1 R_3 \geqq \frac{E_{in}}{2}$$

transistor $Q_1$ develops a heavy forward bias on the emitter-base diode and therefore becomes saturated. Beyond this potential $E_2$ is equal to $E_{in}$ less $I_1R_3$. Upon applying a short circuit to terminals 9 and 10, $E_2$ is equal to 0, $I_1R_3$ is equal to $E_{in}$ and the short circuit current is limited to $$\frac{E_{in}}{R_3}$$

which is a safe value for all components.

In again studying the results achieved by the embodiment of the present invention as described herein, it will be seen that the average voltage $E_2$ (or the average output voltage) remains constant at approximately 100% of nominal value as the average A.-C. current $I_2$ varies from zero to 110% of full load. This value of $I_2$ is the limit of active "on" operation of the transistor $Q_1$, i.e. the stage during which power is amplified in the transistor $Q_1$ before saturation begins. In the saturated region the circuit behaves as if transistor $Q_1$ did not exist and the voltage $E_2$ is controlled almost exclusively by the resistance $R_3$, gradually decreasing to zero along a straight line. The maximum load current is $E_{in}/R_3$ at short circuit of voltage $E_2$ (or short circuit of terminals 9 to 10) and occurs at 220% of the rated current value of the circuit.

The above description pertains particularly to the overcurrent protecting abilities of the circuit in FIG. 1. Frequently the voltage supplied by the voltage source varies from its nominal value as a result of poorly regulated inputs or transient surges whereby the voltage at the base $b$ of transistor $Q_1$ and hence the emitter $e$ at transistor $Q_1$ varies therewith. The effects of such voltage variations upon the voltage $E_2$ are controlled in large part by the rapidly saturable transformer $TR_2$.

In considering the effects of the saturable transformer $TR_2$, the effect of capacitor $C_2$ will be at first neglected. The following relationship expresses to within 10%, the saturation flux density of the transformer iron used in transformer $TR_2$.

$$B_{max}=\frac{E_{avg}\times 10^8}{4FNA}$$

Where $B_{max}$ is within 10% of the saturation flux density of the transformer iron;
$F$=the frequency input to the transformer primary winding
$N$=one-half the primary winding turns
$A$=transformer core area
$E_{avg}=E_2$ (D.C. 0)

Thus the average D.-C. voltage of $E_2$ is determined by the saturation flux of the transformer $TR_2$ (this assumes of course that the frequency of the oscillator 1 is constant). The flux necessary for saturation of the transformer is selected such that at 100% of nominal voltage, saturation of the transformer will occur at the end of one-half cycle of the input frequency to the transformer $TR_2$ and hence the output frequency of oscillator 1. For example, if the output frequency of the oscillator 1 is 40 cycles per second, than one-half of one cycle of such frequency lasts 12.5 milliseconds. Accordingly, the windings of the transformer $TR_2$ and the core therein are selected to produce saturation after 12.5 milliseconds of current flow produced by 100% of normal operating potential. With such windings, an increase above the nominal value in the voltage of $E_2$ applied across half of winding 5, when transformer $TR_2$ is unsaturated, causes saturation of transformer $TR_2$ prior to the elapse of 12.5 milliseconds. The before-mentioned increase above the nominal value of voltage $E_2$, of course, will result from an increase or surge of voltage $E_{in}$ so that the early saturation of transformer $TR_2$ (prior to 12.5 milliseconds) is a direct outcome of upward changes in input voltage.

The winding 5 of transformer $TR_2$ exhibits a substantially higher impedance when the core of the transformer is unsaturated than when it is saturated. In fact the transformer behaves as a short circuit in its saturated region. In view of the above, voltage measurements from the centertap to one terminal of transformer winding 5, would indicate, in response to an abruptly applied step-function potential, an abrupt rise followed by a sudden drop upon the occurrence of saturation.

Referring to FIG. 3*a*, there is shown the voltage in the windings of $TR_2$ when the input voltage is the nominal value. The voltage curve in FIG. 3*a* indicates that since the transformer $TR_1$ is not quite saturated when one-half cycle or 12.5 milliseconds have elapsed, the voltage across the windings increases upon saturation of one of the transistors $Q_2$ or $Q_3$ being turned on hard and immediately reverses polarity upon one-half cycle being completed. In curve of FIG. 3*b* the input voltage is 150% of the normal input voltage $E_{in}$, causing the voltage at the emitter $e$ of transistor $Q_1$ to increase proportionately as a result of the increase at the base $b$ of that transistor. The greater voltage which is instantaneously placed across the windings when transistor $Q_2$ or $Q_3$ is turned on hard is productive of a greater flux growth rate causing earlier saturation of the transformer $TR_2$. Saturation of the transformer reduces the internal impedance in one-half of the winding 5 and it becomes substantially zero prior to the half-cycle being completed. The curve of FIG. 3*c* similarly shows this effect for an input voltage 200% of nominal value where saturation occurs at an even earlier time.

The effect of voltage in the windings of $TR_2$ is shown in the voltage $E_2$ which is depicted in FIGS. 4*a*, 4*b*, and 4*c* for an input voltage value of 100% for the curve in FIG. 4*a*, 150% for the curve in FIG. 4*b* and 200% of rated value for the curve in FIG. 4*c*. The second drop in voltage resulting from saturation shown in FIGS. 3*b* and 3*c* is reflected in FIGS. 4*b* and 4*c* by a step function falling to zero and rising again after the half-cycle. It will be noted that no step function exists for the curve in FIG. 4*a* since the transformer $TR_2$ does not saturate at the nominal value of input voltage. The curves in FIGS. 5*a*, 5*b*, and 5*c* exemplify the currents in the resistor $R_3$ for the conditions of 100% rated voltage input, 150% rated voltage input and 200% rated voltage input respectively.

For values of current $I_1$ below full load the average value or the time integral of the voltage $E_2$ is constant but the instantaneous values of $E_2$ are proportional to the increase in the input voltage $E_{in}$. That is, in the absence of capacitor $C_1$, the instantaneous steps of voltage $E_2$ would be proportional to whatever surge voltages appeared at $E_{in}$.

The additional capacitor $C_1$ alters the nature of the voltage $E_2$ with respect to the surge voltages as well as high steady-state voltages. Considering the example of the circuitry of FIG. 1 having an output of 40 cycles per second, the charging time constant of capacitor $C_1$ is $$t=C_1R_3=50\text{ ohms}\times 600\text{ microfarads}=30\text{ milliseconds}$$

The half-period of 40 cycles is equal to 12.5 milliseconds. The voltage change which may occur across capacitor $C_1$ during 12.5 milliseconds is $$\Delta e_{c1}=\Delta E_2\left(1-\epsilon\frac{-30}{12.5}\right)=\Delta E_2(.33)$$

where $E_2=\frac{1}{2}E_{in}$, and
$\epsilon$=base of natural logarithms

For a step function of 200% of the nominal value of $E_{in}$ the voltage $C_1$ cannot exceed $$E_2\text{ (steady state)}=E_2\text{ (.33) (rise)}=133\%\text{ of }E_2$$

However, since this 133% is greater than 100% the transformer $T_2$ is saturated prior to the elapse of 12.5 milliseconds because, as stated, the frequency and the saturating characteristics of the transformer are selected to cause saturation at 12.5 milliseconds when the voltage $E_2$ is normal. Thus the sudden saturation prevents the capacitor from charging up to the value which it would ordinarily charge up if it could charge for the entire half-cycle.

The above phenomenon is graphically illustrated in the curves of FIG. 6 wherein the reaction of the circuit in FIG. 1, when this circuit is subjected to a 200% surge voltage from the source B, is shown. The nominal voltage $E_2$ (or $\frac{1}{2}E_{in}$) is the maximum voltage shown in curve of FIG. 4*a* and the rise in the surge voltage is defined as $\Delta E_2$. Inspection of FIGS. 1 and 4*a* reveal that under normal operating conditions the capacitor $C_1$ maintains a charge equal to the nominal value of $E_2$. At the start of a half-cycle which occurs upon either transistor $Q_2$ or transistor $Q_3$ being turned on hard, the transformer $TR_2$ remains unsaturated and the voltage $E_2$ is substantially maintained across half of the winding 5. However, since a surge voltage exists, the voltage across the winding will attempt to perform the excursion illustrated in FIG. 3*c*. Since the voltage across a capacitor cannot change suddenly the capacitor charges at a rate equal to $R_3C_1$ and performs the excursion which is defined as "charging rate" or $R_3C_1$ in FIG. 6. This excursion would at 12.5 milliseconds reach a value of $1.33E_2$ and is shown in the drawing as the point where the charging rate crosses 12.5 milliseconds. However due to the higher voltage in the windings, saturation of transformer $TR_2$ occurs at an earlier moment such as defined by point 10 on the charging curve of capacitor $C_1$ and suddenly reduces the value of one-half of the winding impedance to 1 ohm so as to result in rapid discharge of the capacitor $C_1$ by the curve defined as "discharge rate."

Discharge rate $=R_pC_1=1\times 600\times 10^{-6}=.6$ millisecond where $R_p=1$ ohm, the resistance of one-half of the winding.

Discharge of capacitor $C_1$ continues until the beginning of the next half-cycle when the capacitor $C_1$ is again charged. The final value of $E_2$ at 12.5 milliseconds is less than its nominal value due to the rapid discharge rate of $R_pC_1$. $E_{out}$ is accordingly limited.

A feature which illustrates the advantages of the present invention is the fact that all components within the protecting portion of the circuit are completely protected themselves. During short-circuit transistor $Q_1$ carries only 220% of normal current at very low saturation voltage, and transistors $Q_2$ and $Q_3$ switch 220% rated current at a voltage $E_2$ which is virtually zero. Transistors are selected such that the allowable maximum currents thereof exceed the maximum current possible in such a circuit. Such transistors are readily available for currents up to 50 amperes and are substantially the same cost and structural size of diodes having lower allowable maximum values. A further advantageous result achieved by the circuit of FIG. 1 is that the transistor $Q_1$ dissipates a negligible amount of power at no load and short-circuit currents and that maximum power is dissipated at one-half load and one-half voltage. Although transistor $Q_1$ handles 220% of nominal current and 100% of the nominal voltage, i.e.

$$\frac{E_{in}}{2}$$

its maximum dissipation is only 55% of nominal current multiplied by one-half the nominal voltage, or approximately one-quarter of the power it controls.

Over-voltage protection is accomplished in this inverter by an output transformer which saturates at higher than normal input voltages and by a capacitor across the primary winding of the output transformer having a charging rate substantially greater than the period of one transformer alternation. The greater the charging time-constant of the capacitor $C_1$ and resistor $R_3$ the more adequate the protection. The discharge rate is also of great importance. It must be sufficiently fast to prevent capacitor voltage from building up to the surge voltage after a few cycles. The fast discharge time of the capacitor is the result of the low resistance of the primary winding 5 of transformer $TR_2$ which has a value such as 1 ohm per half-winding.

In the examples cited in the present application the frequency of 40 cycles for the oscillator 1 was chosen to demonstrate the effectiveness of the circuit without resorting to the transient performance of the transistor $Q_1$. Laboratory data taken with an oscillator 1 operating at 20 cycles per second show that the maximum voltage response to a 200% surge exhibits a rise of 33% in the nominal voltage $E_2$. The transient performance of the transistor $Q_1$ obviously becomes increasingly important in the charging rate as the charging current decreases below $$\frac{E_{av}}{R_3}$$

This, however, was neglected in the present application since for the example shown it was unnecessary.

Extremely high but short-duration voltage spikes are readily dissipated almost entirely by the resistor $R_3$. A short high spike of charging current will saturate the transistor $Q_1$ and only 6% of a 1 kilocycle spike will appear across the capacitor $C_1$.

It will be obvious to those skilled in the art upon a study of this disclosure that our invention is amenable to a variety of modifications with respect to circuitry and circuit components and may be used for other purposes without departing from the essential features of our invention and within the scope of the claims annexed hereto.

We claim:

1. A transistor switching circuit comprising direct-voltage source means having two terminals, saturable transformer means having a primary winding connected to one of said terminals and having a secondary output winding, switching transistor means having an emitter-base circuit and an emitter-collector circuit, said emitter-collector circuit connecting said primary winding to the other of said terminals, alternating-current control means connected to the emitter-base circuit of said transistor means for alternately biasing said transistor means on and off to induce an alternating current in said secondary winding, and capacitor means connected from a point on the primary winding of said saturable transformer means across said switching transistor means for limiting voltage excursions across said primary winding whereby the voltage at the secondary output winding of said saturable transformer means is regulated.

2. A transistor switching circuit comprising direct-voltage source means having two leads, regulating means connected to said leads and including power-dissipating resistance means serially connected to one of said leads and and a pair of supply terminals, saturable transformer means having a secondary output winding and having a primary winding connected to one of said terminals, switching transistor means having an emitter-base circuit and having an emitter-collector circuit connecting said primary winding to the other of said terminals, alternating-current control means connected to the emitter-base circuit of said transistor means for alternately biasing said transistor means on and off to induce an alternating current in said secondary winding, and capacitor means connected from a point on the primary winding of said saturable transformer means across said switching transistor means for limiting voltage excursions across said primary winding whereby the voltage at the secondary output winding of said saturable transformer means is regulated.

3. A transistor switching circuit comprising direct-voltage source means having two terminals, saturable transformer means having a secondary output winding and a primary winding, said primary winding having ends and a tap intermediate the ends to define two primary winding portions, said tap being connected to one of said terminals, a pair of switching transistor means each having an emitter-base circuit and an emitter-collector circuit, said emitter-collector circuits being serially connected from respective ends of said primary windings to the other of said terminals and each being adapted to permit major current flow through said primary winding in the opposite direction, alternating-current control means connected to the emitter-base circuits of each of said transistor means for alternately biasing each transistor means on and off in phase opposition to each other to produce current flow first through one primary winding portion and one transistor means and then through the other primary winding portion and the other transistor means, whereby an alternating current is induced in said secondary winding, and capacitor means connected from the tap of the primary winding of said saturable transformer means across said switching transistor means for limiting voltage excursions across said primary winding whereby the voltage at the secondary output winding of said saturable transformer means is regulated.

4. A transistor switching circuit comprising direct-voltage source means having two leads, regulating means connected to said leads and including a pair of voltage supply terminals as well as power-dissipating resistance means serially connected to one of said leads, saturable transformer means having a secondary output winding and having a primary winding connected to one of said terminals, switching transistor means having an emitter-base circuit and having an emitter-collector circuit connecting said primary winding to the other of said terminals, alternating current control means connected to the emitter-base circuit of said transistor means for alternately biasing said transistor means on and off to induce an alternating current in said secondary winding, said control means having a frequency at which the voltage of said source means when exceeding a predetermined value causes the current flow through said primary winding to saturate said transformer means prior to termination of that current flow in one direction, and capacitor means connected from a point on the primary winding of said saturable transformer means across said switching transistor means and defining with said resistance means a time constant substantially greater than one-half cycle of the frequency of said control means.

5. A transistor switching circuit comprising direct-voltage source means having two leads, regulating means connected to said leads and including a pair of voltage supply terminals as well as power-dissipating resistance means serially connected to one of said leads, saturable transformer means having a secondary output winding and having a primary winding connected to one of said terminals, switching transistor means having an emitter-base circuit and having an emitter-collector circuit connecting said primary winding to the other of said terminals, alternating current control means connected to the emitter-base circuit of said transistor means for alternately biasing said transistor means on and off to induce an alternating current in said secondary winding, said control means having a frequency at which the voltage of said source means when above a predetermined value causes saturation of said transformer means prior to termination of that current flow in one direction, and capacitor means connected from a point on the primary winding of said saturable transformer means across said switching transistor means and defining with said resistance means a time constant substantially greater than one-half cycle of the frequency of said control means, said regulating means including voltage dividing means connected across said leads and a transistor having a collector connected to said resistance means, said transistor also having a base connected to an intermediate potential of said voltage dividing means and an emitter connected to one of said terminals, said resistance means having a value to cause saturation of said transistor when the collector current exceeds a predetermined value.

6. A transistor switching circuit comprising direct-voltage source means having two leads, regulating means connected to said leads and including a pair of voltage supply terminals as well as power-dissipating resistance means serially connected to one of said leads, saturable transformer means having a secondary output winding and having a primary winding connected to one of said terminals, switching transistor means having an emitter-base circuit and having an emitter-collector circuit connecting said primary winding to the other of said terminals, said regulating means including voltage dividing means connected across said leads, a transistor having a collector connected to said resistance means, said transistor also having a base connected to an intermediate potential of said voltage dividing means and an emitter connected to one of said terminals, said resistance means having a value to cause saturation of said transistor when the collector current exceeds a predetermined value, and capacitor means connected from a point on the primary winding of said saturable transformer means across said switching transistor means for limiting voltage excursions across said primary winding whereby the voltage at the secondary output winding of said saturable transformer means is regulated.

7. A transistor switching circuit comprising direct-voltage source means having two leads, regulating means connected to said leads and including a pair of voltage supply terminals as well as power-dissipating resistance means serially connected to one of said leads, saturable transformer means including a secondary output winding and further including a primary winding having ends and a tap intermediate the ends to define two primary winding portions, said tap being connected to one of said terminals, a pair of switching transistor means each having an emitter-base circuit and an emitter-collector circuit, said emitter-collector circuits being serially connected from respective ends of said primary windings to the other of said terminals and each being adapted to permit major current flow through said primary winding in the opposite direction, alternating current control means connected to the emitter-base circuits of each of said transistor means for alternately biasing each transistor means on and off in phase relation opposite to each other to produce current flow first through one primary winding portion and one transistor means and then through the other primary winding portion and the other transistor means whereby an alternating current is induced in said secondary winding, said control means having a frequency such that the voltage of said source means, when exceeding a predetermined value, causes the current flow through said primary winding to saturate said transformer means prior to termination of that current flow in one direction, and capacitor means connected from the tap of the primary winding of said saturable transformer means across said switching transistor means for limiting voltage excursions across said primary winding whereby the voltage at the secondary output winding of said saturable transformer means is regulated.

8. A transistor switching circuit comprising direct-voltage source means having two leads, regulating means connected to said leads and including a pair of voltage supply terminals as well as power-dissipating resistance means serially connected to one of said leads, a saturable transformer having a primary winding and a secondary winding, said primary winding having two ends and a tap intermediate the ends to define two primary winding portions, said tap being connected to one of said terminals, a pair of switching transistors each having an emitter-base circuit and an emitter-collector circuit, said emitter-collector circuits being serially connected from respective ends of said primary windings to the other of said terminals and each being adapted to permit major current flow through said primary winding in the opposite direction, alternating-current control means connected to the emitter-base circuits of each of said transistors for alternately biasing each transistor on and off in phase relation opposite to each other to produce current flow first through one primary winding portion and one transistor and then through the other primary winding portion and the other transistor, whereby an alternating current is induced in said secondary winding, said control means having a frequency such that when the voltage of said source means exceeds a predetermined value the current flow through said primary winding saturates said transformer means prior to termination of that current flow in one direction, and capacitor means connected from the tap of the primary winding of said saturable transformer means across said switching transistor means and defining with said resistance means a time constant substantially greater than one-half cycle of the frequency of said control means.

9. A transistor switching circuit comprising direct-voltage source means having two leads, regulating means connected to said leads and including a pair of voltage supply terminals as well as power-dissipating resistance means serially connected to one of said leads, a saturable transformer having a primary winding and a secondary output winding, said primary winding having two ends and a midtap to define two primary winding portions, said tap being connected to one of said terminals, a pair of switching transistors each having an emitter-base circuit and an emitter-collector circuit, said emitter-collector circuits being serially connected from the respective ends of said primary winding to the other of said terminals and each being adapted to permit major current flow through said primary winding in the opposite direction, alternating-current control means connected to the emitter-base circuits of each of said transistors for alternately biasing each transistor on and off in phase relation opposite to each other to produce current flow first through one primary winding portion and one transistor and then through the other primary winding portion and the other transistor whereby an alternating current is induced in said secondary winding, said control means having a frequency such that when the voltage of said source means exceeds a predetermined value the current flow through said primary winding saturates said transformer means prior to termination of that current flow in one direction, capacitor means connected between said terminals and defining with said resistance means a time constant substantially greater than one-half cycle of the frequency of said control means, said regulating means including voltage dividing means connected across said leads and a transistor having a collector connected to said resistance means, said transistor also having a base connected to an intermediate potential of said voltage dividing means and an emitter connected to one of said terminals, said resistance means having a value to cause saturation of said transistor when the collector current exceeds a predetermined value, said saturable transformer having a characteristic to saturate upon completion of one-half cycle of current flow therethrough at a given voltage between the terminals.

10. A transistor switching circuit comprising direct-voltage source means having two leads, regulating means connected to said leads and including a pair of voltage supply terminals as well as power-dissipating resistance means serially connected to one of said leads, a saturable transformer including a secondary output winding and a primary winding having ends and a tap intermediate the ends to define two primary winding portions, said tap being connected to one of said terminals, a pair of switching transistors each having an emitter-base circuit and an emitter-collector circuit, said emitter-collector circuits being serially connected from respective ends of said primary windings to the other of said terminals and each being adapted to permit major current flow through said primary winding in the opposite direction, alternating-current control means connected to the emitter-base circuits of each of said transistors for alternately biasing each transistor on and off in phase relation opposite to each other to produce current flow first through one primary winding portion and one transistor and then through the other primary winding portion and the other transistor whereby an alternating current is induced in said secondary winding, said regulating means including a voltage divider connected across said leads and a transistor having a collector connected to said resistance means, a base connected to an intermediate potential of said voltage divider and an emitter connected to one of said terminals, said resistance means having a value to cause saturation of said transistor when the collector current exceeds a predetermined value, and capacitor means connected between the terminals for limiting voltage excursions across said primary winding, whereby the voltage at the output winding is regulated.

11. A transistor switching circuit comprising direct-voltage source means having two terminals; saturable transformer means having a primary winding coupled to one of said terminals and a secondary winding; switching transistor means connecting the primary winding of said saturable transformer means to the other of said terminals; control means coupled to said switching transistor means for alternately biasing said transistor means on and off to induce an alternating current in the secondary winding of said saturable transformer means; and capacitor means connected across the arrangement of said saturable transformer means and said switching transistor means for limiting voltage excursions across said primary winding whereby the voltage at said secondary winding is regulated.

12. A transistor switching circuit comprising direct-voltage source means having two terminals; saturable transformer means having a primary winding coupled to one of said terminals and a secondary winding; switching transistor means connected in series circuit arrangement with the primary winding of said saturable transformer means between said primary winding and the other of said terminals; control means coupled to said switching transistor means for alternately biasing said transistor means on and off to induce an alternating current in the secondary winding of said saturable transformer means; and capacitor means connected across the series circuit arrangement of said saturable transformer means and said switching transistor means for limiting voltage excursions across said primary winding whereby the voltage at said secondary winding is regulated.

13. A transistor switching circuit comprising direct-voltage source means having two terminals; saturable transformer means having a primary winding coupled to one of said terminals and a secondary winding; switching transistor means having an emitter-base circuit and an emitter-collector circuit, said emitter-collector circuit connecting the primary winding of said saturable transformer means to the other of said terminals; control means coupled to the emitter-base circuit of said switching transistor means for alternately biasing said transistor means on and off to induce an alternating current in the secondary winding of said saturable transformer means; and capacitor means connected across the arrangement of said saturable transformer means and the emitter-collector circuit of said switching transistor means for limiting voltage excursions across said primary winding whereby the voltage at said secondary winding is regulated.

14. A transistor switching circuit comprising direct-voltage source means having two terminals; saturable transformer means having a primary winding coupled to one of said terminals and a secondary winding; switching transistor means having an emitter-base circuit and an emitter-collector circuit, said emitter-collector circuit being connected in series circuit arrangement with the primary winding of said saturable transformer means between said primary winding and the other of said terminals; control means coupled to the emitter-base circuit of said switching transistor means for alternately biasing said transistor means on and off to induce an alternating current in the secondary winding of said saturable transformer means; and capacitor means connected across the series circuit arrangement of said saturable transformer means and the emitter-collector circuit of said switching transistor means for limiting voltage excursions across said primary winding whereby the voltage at said secondary winding is regulated.

References Cited by the Examiner

UNITED STATES PATENTS

| | | | |
|---|---|---|---|
| 2,783,384 | 2/57 | Bright et al. | 321—44 |
| 3,009,093 | 11/61 | Seike | 321—2 X |

OTHER REFERENCES

"Power and Control," E. W. Manteuffel, article of the International Solid-State Circuits Conference, February 15, 1961, pages 46 and 47.

LLOYD McCOLLUM, *Primary Examiner.*